United States Patent
Uchida

(10) Patent No.: US 7,509,616 B2
(45) Date of Patent: Mar. 24, 2009

(54) INTEGRATED CIRCUIT LAYOUT DESIGN SYSTEM, AND METHOD THEREOF, AND PROGRAM

(75) Inventor: Risako Uchida, Tokyo (JP)

(73) Assignee: NEC Corporation, Tokyo (JP)

( * ) Notice: Subject to any disclaimer, the term of this patent is extended or adjusted under 35 U.S.C. 154(b) by 269 days.

(21) Appl. No.: 11/375,257

(22) Filed: Mar. 15, 2006

(65) Prior Publication Data

US 2006/0225017 A1    Oct. 5, 2006

(30) Foreign Application Priority Data

Mar. 16, 2005    (JP)    ............................. 2005-074191

(51) Int. Cl.
*G06F 17/50*    (2006.01)
(52) U.S. Cl. ............................... 716/12; 716/13; 716/14
(58) Field of Classification Search .................... 716/12, 716/13, 14
See application file for complete search history.

(56) References Cited

U.S. PATENT DOCUMENTS 7,284,214 B2 * 10/2007 LeBritton et al. ............... 716/5

FOREIGN PATENT DOCUMENTS

JP    6-37183 A    2/1994

* cited by examiner

*Primary Examiner*—Vuthe Siek
*Assistant Examiner*—Magid Y Dimyan
(74) *Attorney, Agent, or Firm*—Sughrue Mion, PLLC

(57) ABSTRACT

There is provided an integrated circuit layout design method capable of performing LVS verification in an early stage of layout design. Placement and routing means provides wiring and outputs a layout in which short circuits are possibly left uncorrected. Short-circuit correcting means performs rewiring by using a newly defined tentative wiring layer in which short-circuit wiring portions are removed and outputs an inter-layer method for interconnecting the tentative wiring layer and the original wiring layer to an inter-layer connection information file. Layout verification means uses the corrected layout and an LVS rule file in which the inter-layer connection method is reflected to perform LVS on the layout in which the short circuit portions are modified to correct connections through use of the tentative wiring layer.

6 Claims, 12 Drawing Sheets

--Prior Art--

--Prior Art--

INTEGRATED CIRCUIT LAYOUT DESIGN SYSTEM, AND METHOD THEREOF, AND PROGRAM

BACKGROUND OF THE INVENTION

1. Field of the Invention

The present invention relates to an integrated circuit layout design system, and method thereof, and program and, in particular, to a layout verification method for the layout design of semiconductor integrated circuits.

2. Description of the Prior Art

One example of the conventional semiconductor integrated circuit layout design technologies is shown in FIG. 15. Referring to FIG. 15, the system includes placement and routing means 1601, layout verification means 1602, an LVS (Layout Versus Schematic verification) rule file 1611, and a layout database 1612. The layout verification is carried out by following a procedure shown in the flowchart in FIG. 16.

Referring to FIG. 16, a mask layout of libraries such as basic logic gate cells, macro cells, and substrates is first created and only terminal geometries and wiring prohibited areas are extracted from the mask layout to generate a layout used by the placement and routing means 1601 (step 1). The mask layout of a library is verified by the layout verification means 1602 and, if no errors are found (step 2), then the layout is stored in the layout database 1612.

Then, cells are placed and wiring is provided between the cells by the placement and routing means 1601 (step 3). The placement and routing means 1601 performs design rule checks based on the layout for the placement and routing means and repeats rewiring until no error is found (step 4), and then outputs a mask layout resulting from the placement and wiring to the layout database 1612. The layout verification means 1602 retrieves from the layout database 1612 the libraries such as cell and substrate and the mask layout resulting from the placement and wiring and performs an LVS verification based on the LVS rule file 1611 (step 5). If an error is found, the library correction (step 1) or placement and wiring (step 3) are repeated until no errors are found (step 6). Then, the layout design is completed.

A technique for the LVS verification in layout design is disclosed in Japanese Patent Laid-Open No. 6-37183.

In the design process shown in FIG. 16 which is performed by the conventional layout design system shown in FIG. 15, the LVS verification is performed after wiring errors are eliminated. In the LVS verification, a larger number of variances between a layout and a schematic will decrease the precision of specifying erroneous portions and increase the number of erroneous outputs. At worst, it will become difficult to perform error analysis. Among other wiring errors, short circuits in wiring, are erroneous connections that do not conform to the schematic. Therefore, the LVS verification cannot be performed until the number of short circuits in wiring is adequately reduced.

If an error is found through the LVS verification, the conventional design process returns to the library creation step or placement and wiring step. Especially in design that involves development of a new library, the library design step and the placement and wiring step are performed concurrently and it is often the case that so many errors are detected in a mask layout of a library that the designers must go back to the library creation step to correct the library layout.

Thus, the conventional layout design systems have the problem that the LVS verification cannot be performed until the number of short circuits in wiring is sufficiently reduced and, if errors are detected in the LVS verification, designers must go back to the library creation step to correct the library, which can unexpectedly delay completion of the layout design at the last minute.

The technique described in Japanese Patent Laid-Open No. 6-37183 attempts to improve the efficiency of LVS error analysis by detecting certain types of LVS errors by means of a different verification means in an early stage to reduce the number of errors found in the LVS stage. In Japanese Patent Laid-Open No. 6-37183, however, no mention is made of wiring errors that can occur in the course of layout design. Therefore, also in the technique disclosed in Japanese Patent Laid-Open No. 6-37183, the LVS verification cannot be performed until the number of short circuits in wiring is adequately reduced. Thus, the problem stated above persists.

An object of the present invention is to provide an integrated circuit layout design system, and method thereof, and program, capable of enabling the LVS verification in an early stage of layout design.

BRIEF SUMMARY OF THE INVENTION

A layout design system according to the present invention is a system for designing a layout of an integrated circuit, including short-circuit correction means for correcting a short circuit in wiring and layout verification means for comparing the layout corrected by the short-circuit correction means with the integrated circuit.

A layout design method according to the present invention is a method for designing a layout of an integrated circuit, including a short circuit correction step of correcting a short circuit in wiring and a layout verification step of comparing the corrected layout with the integrated circuit.

A program according to the present invention is a program for causing a computer to perform a method for designing a layout of an integrated circuit, including a short-circuit correction process of correcting a short circuit in wiring and a layout verification process of comparing the corrected layout with the integrated circuit.

DETAILED DESCRIPTION OF THE PREFERRED EMBODIMENTS

Figure 1:
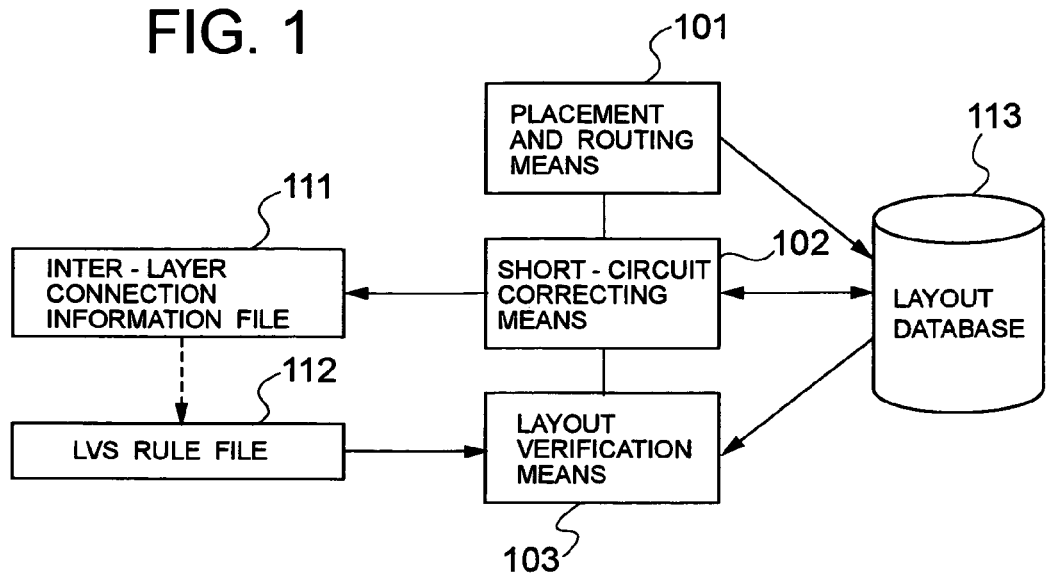
FIG. 1 is a functional block diagram showing a configuration of an embodiment of the present invention.

Embodiments of the present invention will be described below in detail with reference to the accompanying drawings. FIG. 1 is a block diagram of a system according to an embodiment of the present invention. Referring to FIG. 1, the system of the embodiment includes placement and routing means 101, short-circuit correcting means 102, and layout verification means 103. It also includes an inter-layer connection information file 111, an LVS rule file 112, and a layout database 113. The means 101, 102, and 103 operate in principle as follows.

The placement and routing means 101 performs wiring after placing devices and outputs the result of the placement and wiring into the layout database 113. For nets that are difficult to wire, the placement and routing means 101 permits short circuits. The short-circuit correcting means 102 reads a wiring layout of a net containing short circuits from the layout database 113, corrects the short circuits with a newly defined tentative wiring layer, and outputs the layout to the layout database 113. It also outputs a description of a method for providing an inter-layer connection between the tentative wiring layer and the original wiring layer to the inter-layer connection information file 111. The description of the inter-layer connection method includes at least a description of a set of the two wiring layers to be interconnected and the interconnection layer (via layer) interconnecting the two wiring layers.

The layout verification means 103 reads the LVS rule file 112 in which the information in the inter-layer connection information file 111 is reflected and layout data in which short circuits have been corrected from the layout database 113, and performs an LVS using them.

Figure 2:
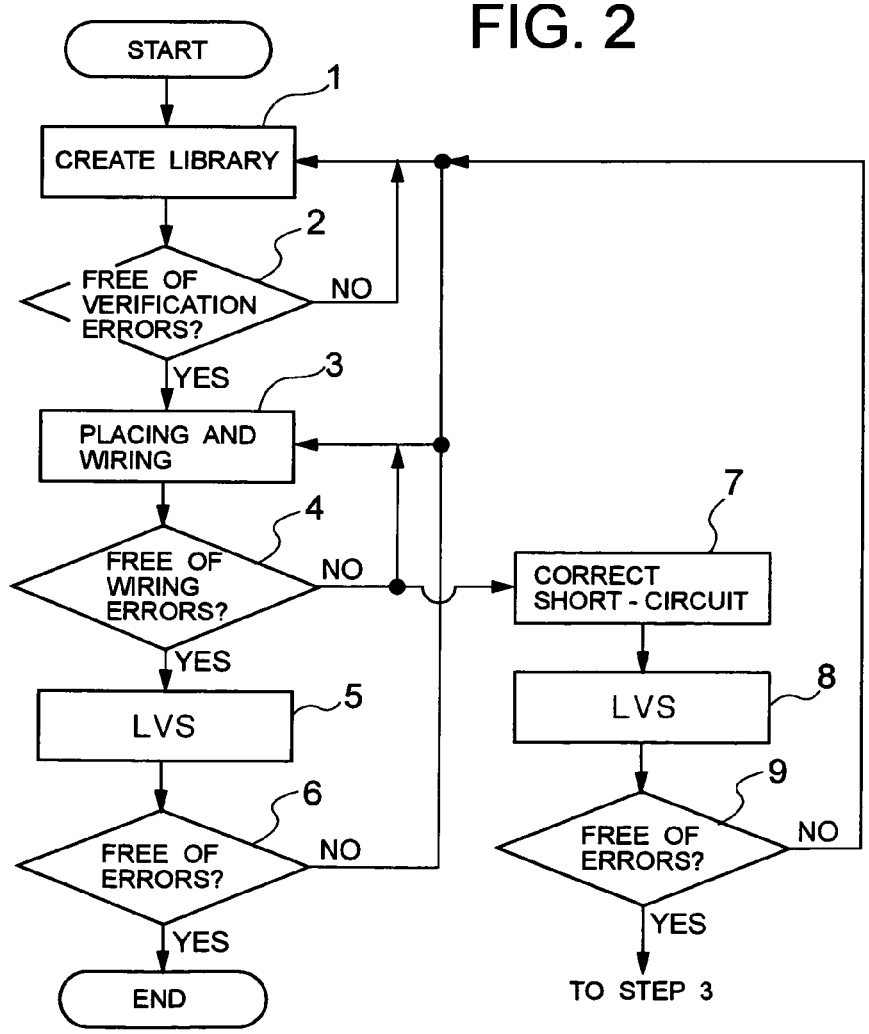
FIG. 2 is a flowchart illustrating an operation according to an embodiment of the present invention.
Figure 16:
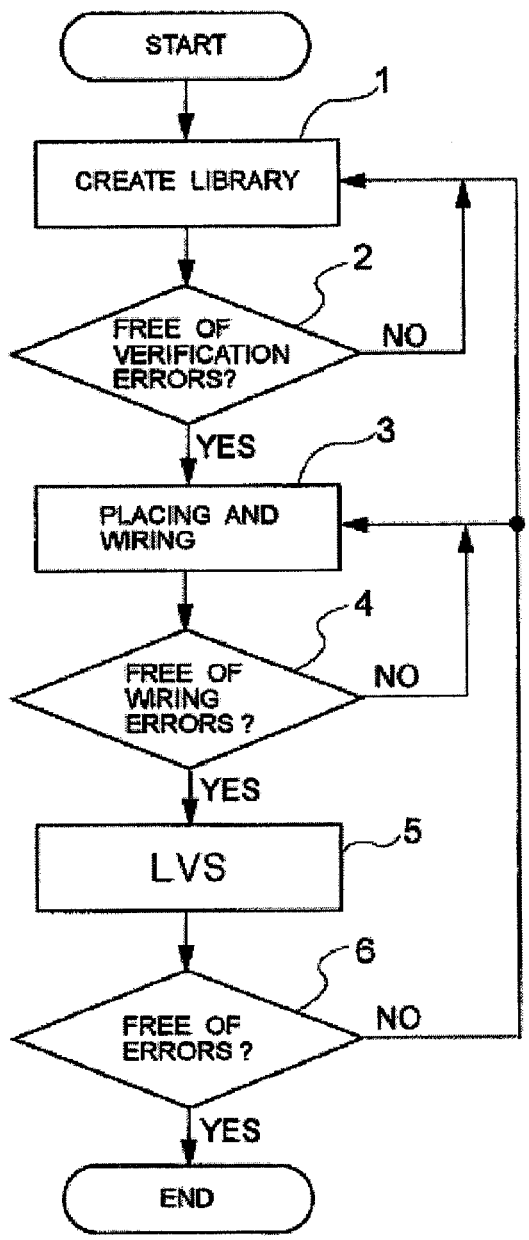
FIG. 16 is a flowchart illustrating an operation of the conventional art shown in FIG. 15.

An operation of an embodiment of the present invention will be described with respect to the flowchart in FIG. 2. In FIG. 2, the same steps as those in FIG. 16 are labeled with the same reference numerals. As with the conventional design process shown in FIG. 16, first a library is created (step 1). Once verification errors are eliminated (step 2), the layout of the library is stored in the layout database 113. Then, cells are placed and wiring is provided between the cells by the placement and routing means 101 (step 3). The placement and routing means 101 performs a design rule check based on a layout prepared for the placement and routing means. If an error is found (step 4), the placement and routing means 101 returns to step 3 and performs replacement and rewiring, as in the conventional design process.

If an error is found at step 4, the process proceeds to step 7, where the result of the wiring is output to the layout database 113, and the layout database 113 is read and written by the short-circuit correcting means 102 to correct short circuits by using a tentative wiring layer, and a description of an inter-layer connection method for the tentative wiring layer is output to the inter-layer connection information file 111.

Then, the layout verification means 103 retrieves the mask layout of the library such as cells and substrates and a mask layout resulting from the corrected placement and wiring from the layout database 113 and performs the LVS verification of the inter-layer connection information file 111 by using the LVS rule file 112, which has been manually or otherwise provided beforehand (step 8). If an error is found (step 9), the process returns to the step of library generation (step 1), where the library is corrected. If no error is found (step 9), the process returns to step 3 to perform the same process on the next placement and wiring.

The placement and wiring at steps 3 and 4 are repeated while at the same time the short-circuit correction and the LVS at steps 7-9 are being performed. Once it is determined at step 4 that wiring errors are eliminated, the subsequent steps are the same as those of the conventional design process (steps 5 and 6).

Figure 3:
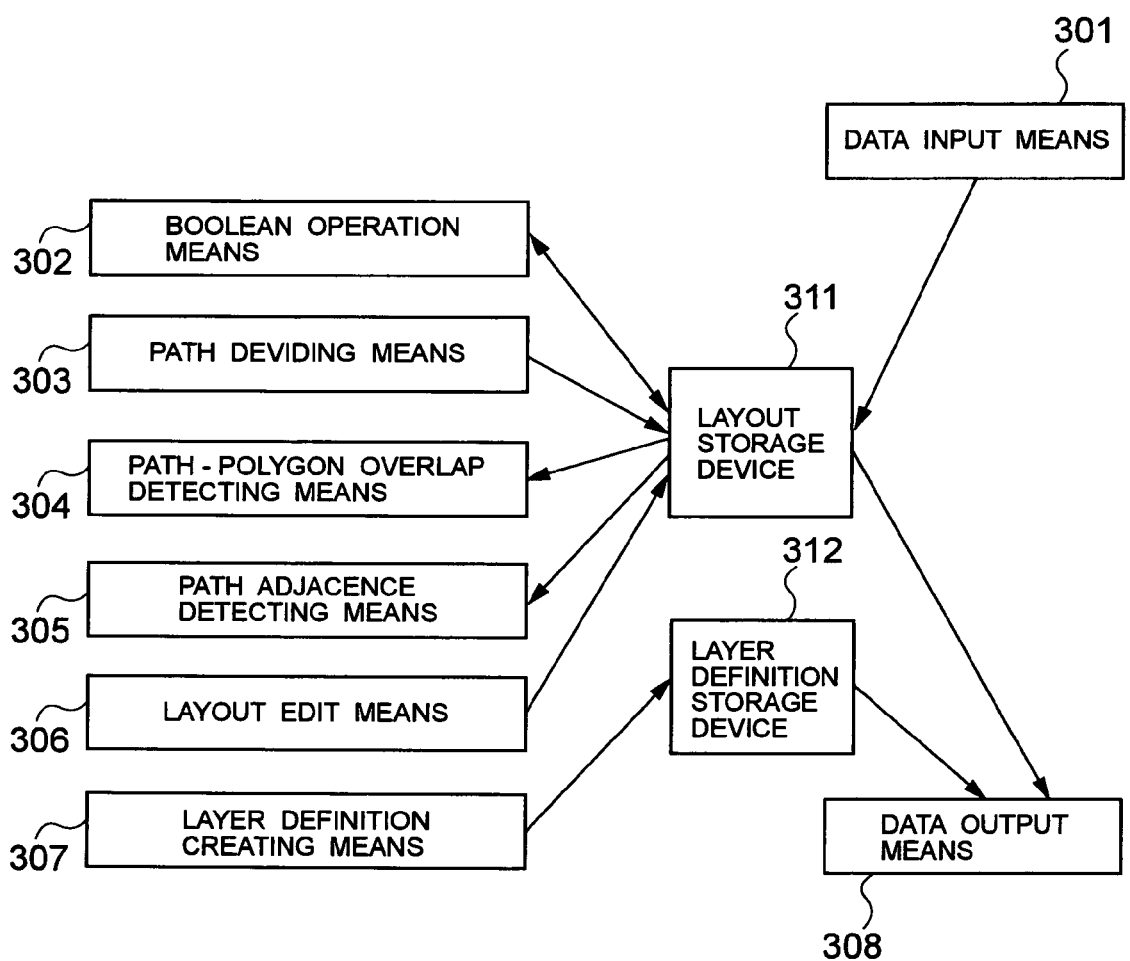
FIG. 3 is a functional block diagram showing a specific configuration of short-circuit correcting means used in a first embodiment of the present invention.

FIG. 3 is a block diagram showing a configuration of the shot-circuit correcting means 102 shown in FIG. 1 according to a first embodiment. Referring to FIG. 3, the short-circuit correcting means 102 includes data input means 301, boolean operation means 302, path division means 303, path-polygon overlap detection means 304, path adjacence detection means 305, layout edit means 306, layer definition creating means 307, data output means 308, a layout storage device 311, and a layer definition storage device 312.

These means and storages operate in principle as follows. The layout storage device 311 stores paths consisting of a set of endpoints, a width definition, and a layer definition, upper and lower wiring layer polygons of layers, and via cells consisting of a lower wiring layer polygon, an upper wiring layer polygon and via layer polygons. A wiring layout is stored as a set of paths and via cells; the results of boolean operations are stored as a set of polygons. The layer definition storage device 312 stores, for each original wiring layer, an arbitrary number of pairs of names of tentative wiring layers and names of virtual via layers connecting the tentative wiring layers with the original wiring layers.

The data input means 301 reads, for each net, a wiring layout consisting of paths and via cells from the layout database 113 and writes the wiring layout for each net in the layout storage device 311. The boolean operation means 302 reads a set of polygons, paths, or a set of via cells from the layout storage device 311, performs a geometric AND operation and geometric OR operation between polygons or between a polygon and the polygon of the contour of a path or via cell, and writes the resulting set of polygons in the layout storage device 311.

The path division means 303 reads a specified path from the layout storage device 311, divides the straight line between the endpoints of the path, excluding corners, into segments with a minimum length, which can be arbitrarily specified, and writes the resulting path in the layout storage device 311. The path-polygon overlap detecting means 304 reads a specified polygon from the layout storage device 311 and searches the layout storage device 311 for paths to detect paths that overlap the polygon in profile.

The path adjacence detecting means 305 reads a specified path from the layout storage device 311, searches the layout storage device 311 for paths to detect paths one of the endpoints of which matches that of the specified path. The layout edit means 306 performs read and write operations in the layout storage device 311 to create, copy, or delete paths and via cells or change layers. The layer definition creating means 307 creates tentative wiring layer names and virtual via layer names for a specified wiring layer, and writes them in the layer definition storage device 312.

The data output means 308 reads a wiring layout of a net from the layout storage device 311 and writes it in the layout database 113 shown in FIG. 1. It also reads a layer definition from the layer definition storage device 312 and outputs to the inter-layer connection information file 111 shown in FIG. 1 a description of a inter-layer connection method for a tentative wiring layer used, including a set of the original wiring layer name, tentative wiring layer names, and virtual via layer names.

Figure 4:
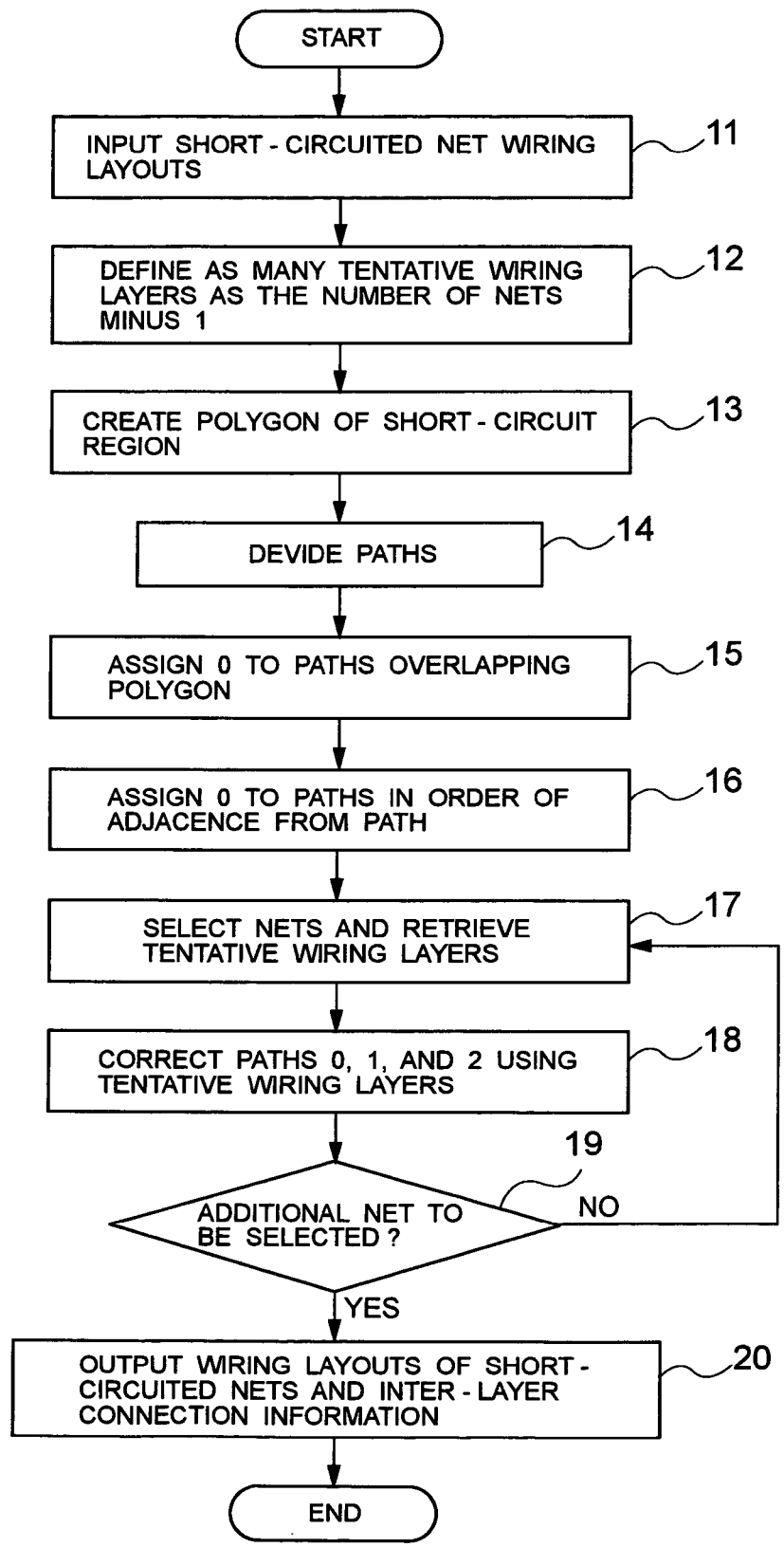
FIG. 4 is a flowchart illustrating an operation of the short-circuit correcting means shown in FIG. 3.

Operation of the first embodiment of the present invention based on the short-circuit correcting means 102 shown in FIG. 3 will be described below in detail with reference to the flowchart in FIG. 4. First, the data input means 301 reads a wiring layout of each of nets shorted to each other from the layout database in FIG. 1 and writes the wiring layout of each net into the layout storage device 311 (step 11). Then, definitions of as many tentative wiring layers as the number of the input nets minus 1 are created for each of all wiring layers of the input wiring layouts by the layer definition creating means 307 and are written in the layer definition storage device 312 (step 12).

Then, two nets are selected from among the input nets and, by the boolean operation means 302, the wiring layouts of the two nets are retrieved from the layout storage device 311 and the AND operation is applied to them. The AND operation is applied on all combinations of two nets. The OR operation is applied to all of the resulting polygons and the results are written in the layout storage device 311 (step 13). Then, by the path division means 303, a path in the wiring layout is divided into segments with the minimum length specified (step 14). A straight line interconnecting two continuous endpoints of the path is drawn and, if more than one straight lines are connected to an endpoint, the start and end points of a corner are obtained from the angle between the straight lines and in the region within the corner the path is not divided.

Then, the wiring layout in the layout storage device 311 is checked by the path-polygon overlap detecting means 304 to detect paths that overlap a polygon generated at step 13, and the detected paths are labeled with number 0 (step 15). Then, paths in the wiring layout in the layout storage device 311 are checked by the path adjacence detecting means 305 to detect a path adjacent to the path labeled 0 in the previous step 15, namely a path one of the endpoints of which coincides that of the path labeled 0, and the detected path is labeled with 1. Further, a path adjacent to the path labeled 1 is detected and labeled with 2 (step 16).

Then, one net is selected from among the nets, except the nets not to be corrected, and one tentative wiring layer for the wiring layer of the net is retrieved from the layer definition storage device 312 (step 17). The nets not to be corrected are determined as appropriate on the basis of an indicator such as the wiring length, whether or not they overlap a terminal geometry, or the priority of wiring.

Copies of the paths labeled 0, 1, and 2 in the wiring layout of the current net in the layout storage device 311 are generated by the layout correcting means 306 and the wiring layer of the copied paths is replaced with a tentative wiring layer, the copy of the paths labeled 2 is replaced with a virtual via layer paired with the tentative wiring layer, and the paths labeled 1 are removed (step 18). Then, if there is an additional net to select, the process returns to step 17; otherwise the step proceeds to the next step (step 19).

Finally, the wiring layout of each net in the layout storage device 311 is output to the layout database 113 in FIG. 1 by the data output means 308. Furthermore, for the tentative wiring layers used, the set of the original wiring layer names, tentative wiring layer names, and virtual via layer names stored in the layer definition storage device 312 is output to the inter-layer connection information file 111 shown in FIG. 1 (step 20).

Figure 5:
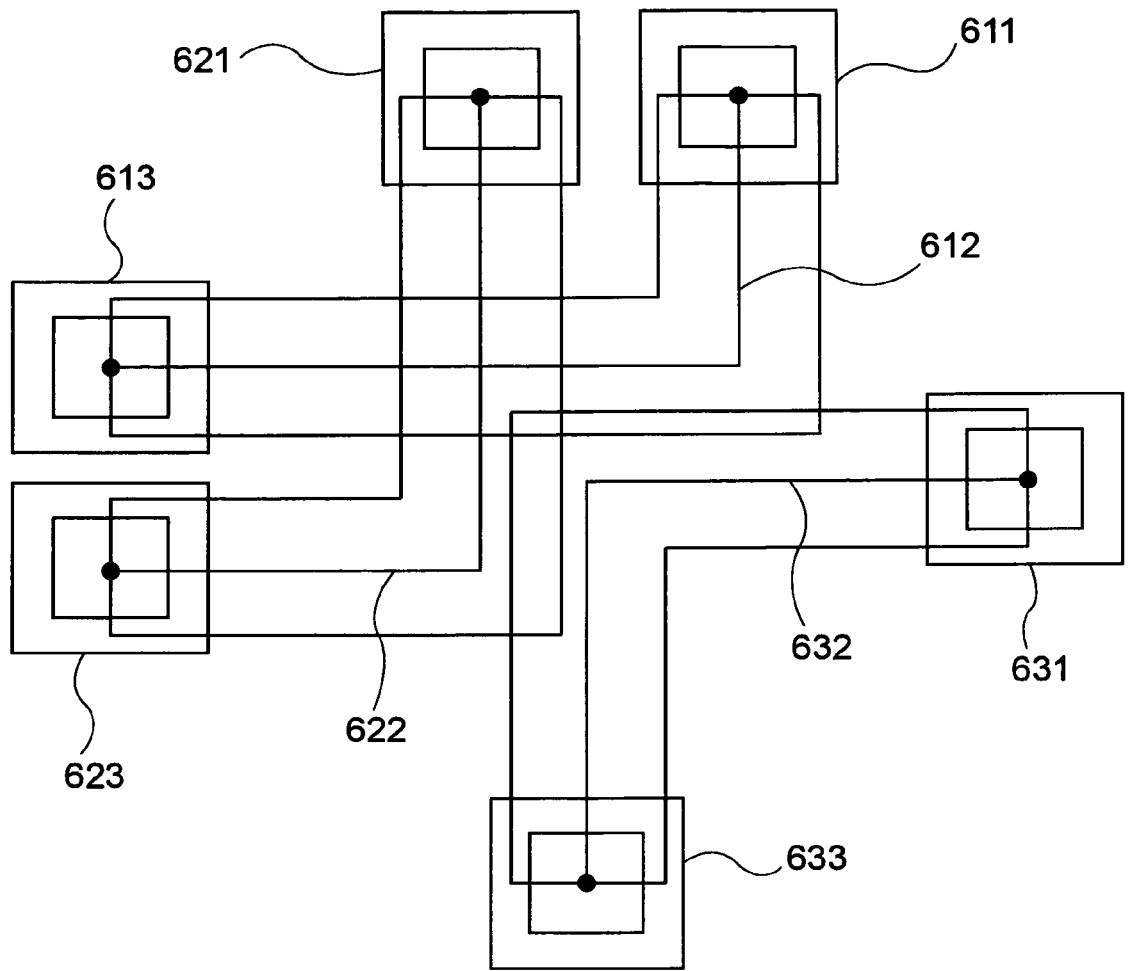
FIG. 5 shows a specific example of a pattern layout used for better explanation of the operation of the embodiment.

The first embodiment of the present invention will be further described below with respect to a specific wiring pattern layout for better lower standing of the first embodiment of the present invention. FIG. 5 shows an example of a wiring layout read from the layout database 113 shown in FIG. 1 and written in the layout storage means 311 in FIG. 3 by the data input means 301 in FIG. 3. Reference numerals 611, 621, and 631 in FIG. 5 denote via cells of a first polysilicon-metal layer and reference numerals 612, 622, and 632 denote paths of a first metal layer. Reference numerals 613, 623, and 633 denote via cells between the first metal layer and a second metal layer.

Via cells 611, 612, and 613 make up a wiring layout of net A; via cells 621, 622, and 623 make up a wiring layout of net B; and via cells 631, 632, and 633 make up a wiring layout of net C. Nets A, B, and C are shorted to one another on the path of the first metal layer.

Figure 6:
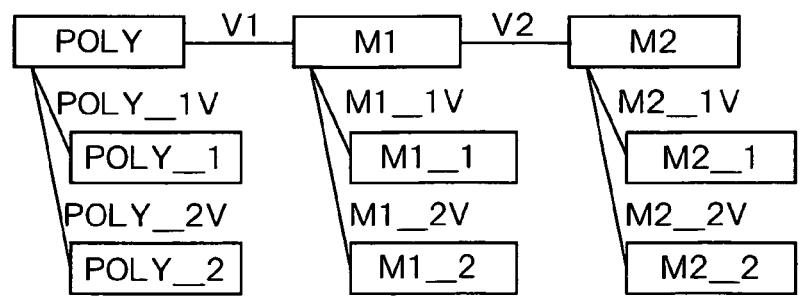
FIG. 6 is a schematic diagram showing an exemplary layer definition and inter-layer connections used in the first embodiment of the present invention.

Because the three nets A, B, and C are shorted to one another, two tentative wiring layers are created for each of the polysilicon, the first metal layer, and the second metal layer by the layer definition creating means 307 in FIG. 3 and are written in the layer definition storage device 3112 in FIG. 3 (step 12). FIG. 6 shows a schematic diagram of an example of the layer definition written in the layer definition storage device 312 and inter-layer interconnections.

In FIG. 6, the polysilicon, the first metal layer, and the second metal layer, which that are the original wiring layers, are denoted as POLY, M1, and M2, respectively, the polysilicon—the via layer of the first metal layer, and the first metal layer—the via layer of the second metal layer, which are original via layers, are denoted as V1 and V2, respectively. The wiring layers are represented by rectangles and the via layers between the wiring layers are represented by straight lines. Tentative wiring layers of the M1 layer are defined as a first tentative wiring layer M1_1 and a second tentative layer M1_2, for example, and virtual via layers paired with these tentative wiring layers are defend as M1_1V and M1_2V, respectively.

Figure 7:
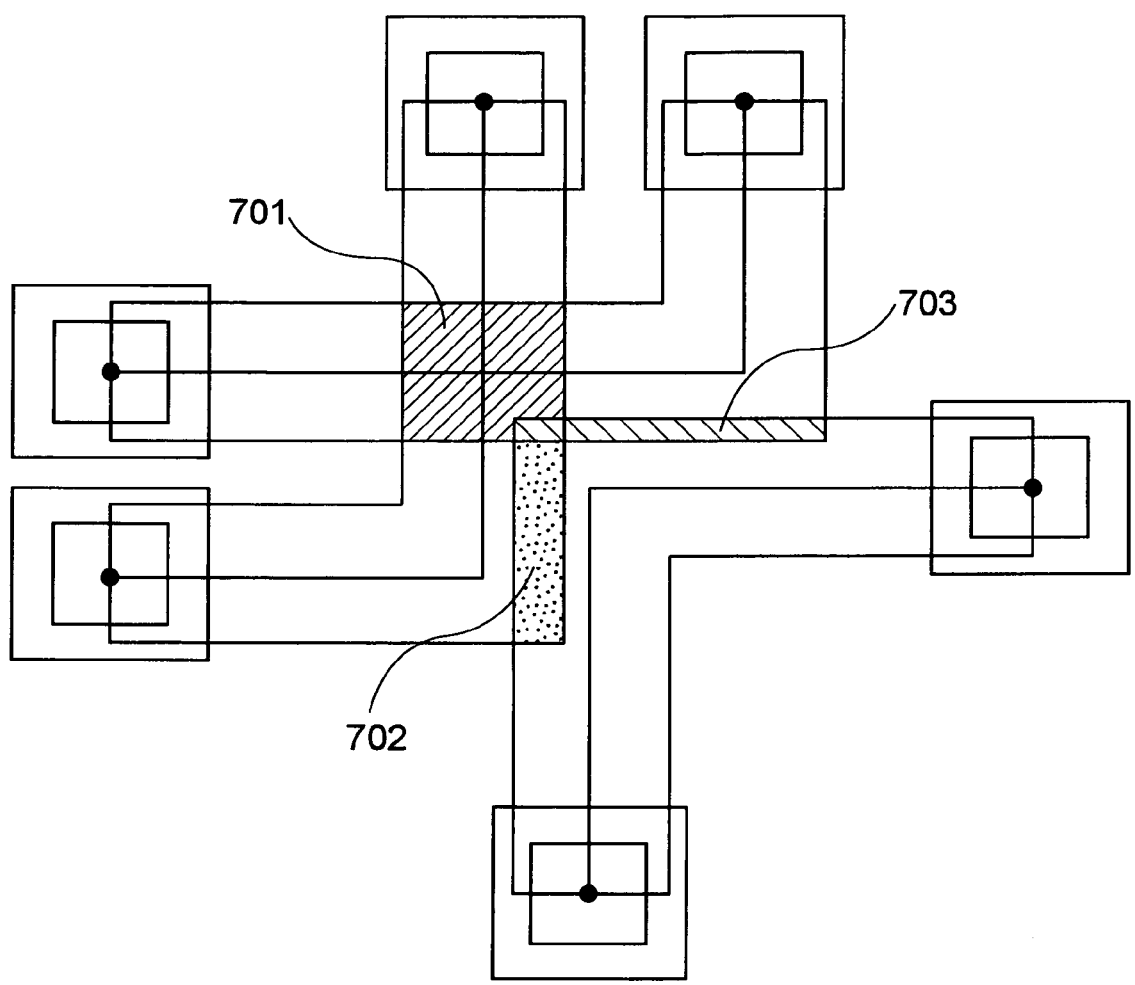
FIG. 7 shows an exemplary polygon in a short-circuit region in the pattern layout shown in FIG. 5.

The AND operation is applied on the three combinations of two nets selected from nets A, B, and C by the boolean operation means 302. As a result, the polygon 701 (portion with hatched lines slanted to the left) in FIG. 7 is obtained from nets A and B, the polygon 702 (dotted portion) in FIG. 7 is obtained from nets B and C, and the polygon 703 (portion with hatched lines slanted to the right) is obtained from nets C and A. The OR operation is applied to the polygon 701 and portions 702 and 703 to obtain the polygon 804 (hatched portion) in FIG. 8 (step 13).

Figure 8:
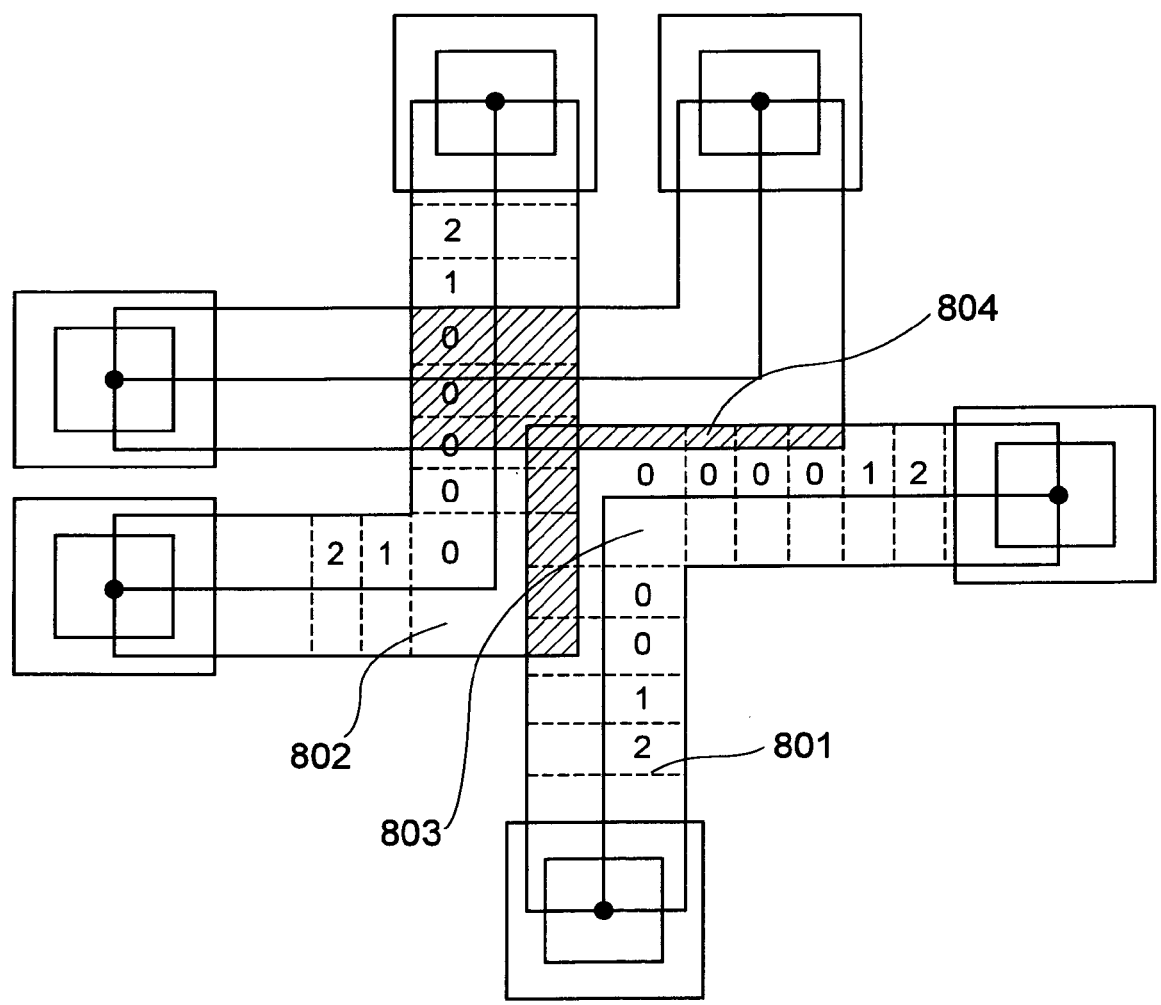
FIG. 8 shows an example of path division in the polygon shown in FIG. 7.

Then, nets B and C are selected from among the three nets as nets to be corrected and the paths included in the wiring layouts of the two nets are divided by the path dividing means 303 as indicated by the dashed lines, such as the dashed line indicated by reference numeral 801 in FIG. 8 (step 14). Because a path is not divided at their corners, a square is produced in a right-angled corner, the length of each side of which is equal to the width of the path as shown in the example (802 and 803 in FIG. 8).

Figure 9:
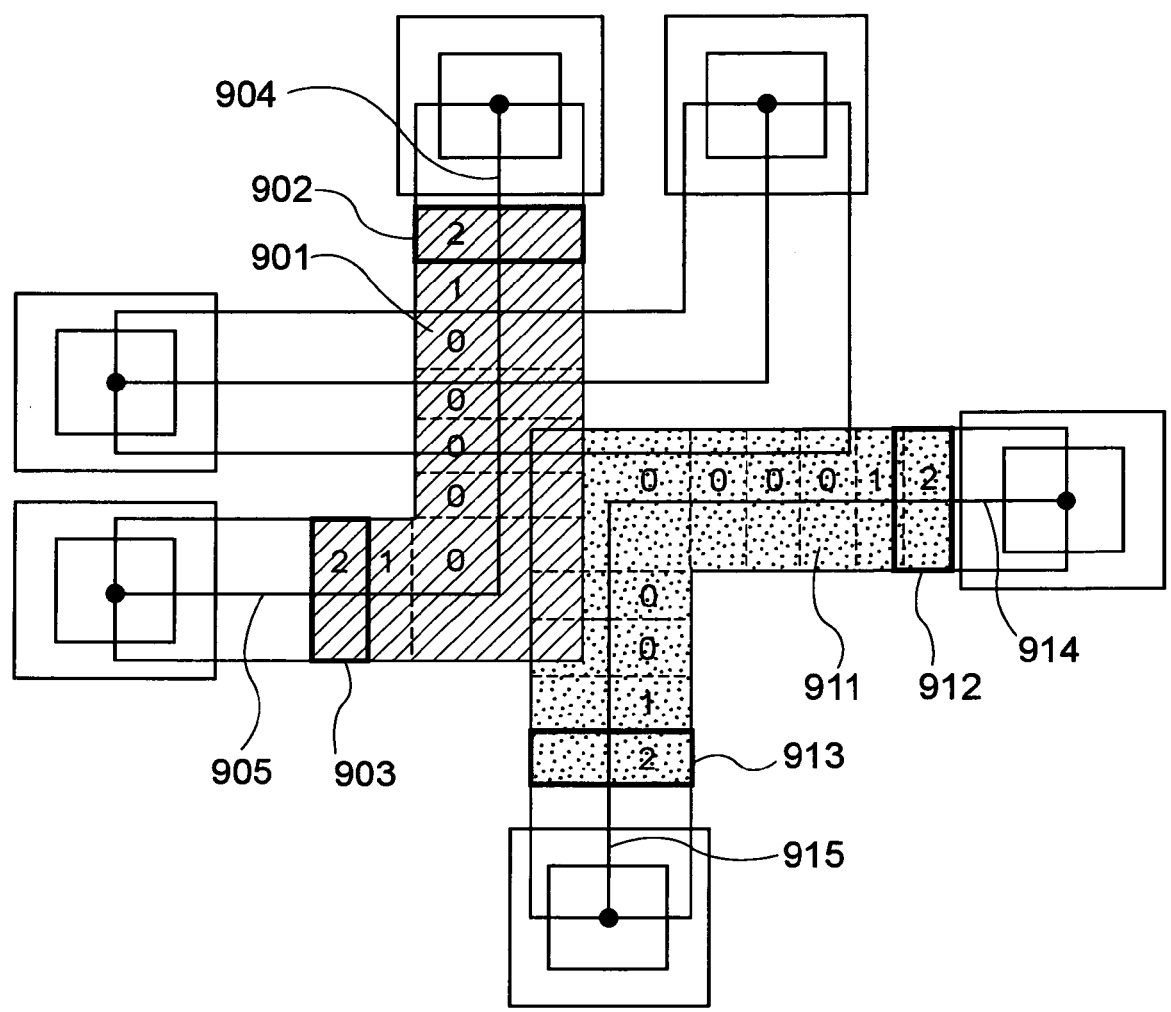
FIG. 9 is a diagram illustrating an example of short-circuit correction by virtual path wiring after path division.

Then, paths that overlap the polygon generated at step 13 are detected by the path-polygon overlap detecting means 304 and are labeled with 0 (step 15). The paths adjacent to a path labeled 0 are labeled with 1 and the paths adjacent to a path labeled 1 are labeled with 2 by the path adjacence detecting means 305 as shown in FIG. 8 (step 16). Then, net B is selected from between nets B and C to be corrected and the first tentative wiring layer M1_1 of the first metal layer is retrieved from the layer definition storage means 312 (step 17). The paths labeled 0, 1, and 2 are copied and the copies are replaced with layer M1_1 by the layout edit means 306 to obtain the portion 901 shown in FIG. 9 (step 18). Furthermore, the paths labeled 2 are copied and the copies are replaced with the virtual via layer M1_1V paired with M1_1 to obtain portions 902 and 903 in FIG. 9. Then, the paths labeled 0 and 1 are removed so that portions 904 and 905 of the paths are left as shown in FIG. 9 (step 19).

Then, net C is selected and the second tentative wiring layer M1_2 of the first metal layer is retrieved from the layer definition storage means 312 (step 17) and step 18 is performed. As a result, the paths of M1_2 are placed in the position 911 in FIG. 9, the paths of the virtual via layer M1_2V are placed in the positions 912 and 913 in FIG. 9, and the paths of M1 are left in positions 914 and 915. Because there is no additional net to be selected, the process proceeds to the next step 20, then the wiring layouts stored in the layout storage device 311 and the definitions of the tentative wiring layers stored in the layer definition storage means 312 are referred to and the inter-layer connection methods for the tentative wiring layers are output to the inter-layer connection information file 111 in FIG. 1 by the data output means 308 (step 20).

If the inter-layer connection method is represented as (wiring layer 1 to be connected, wiring layer 2 to be connected, via layer) for example, then the present embodiment (M1, M1_1, M1_1V) and (M1, M1_2, M1_2V) are output.

Effects of the first embodiment of the present invention described above will be described. In a region where nets A, B, and C overlap one another, net A remains the original wiring layer M1, net B is replaced with the first tentative wiring layer M1_1, and net C is replaced with the second tentative wiring layer M1_2. As a result, the short-circuits have been eliminated. In addition, the connections between the tentative wiring layers and the original wiring layers are retained because an inter-layer connection method is specified in the layout verification means, in which M1_1V layer is placed in the overlap of the original wiring layer M1 of net B and its tentative wiring layer M1_1, layer M1_2V is placed in the overlap of the original wiring layer M1 of net C and its tentative wiring M1_2, and M1 and M1_1 are interconnected in the overlap with M1_1V, and M1 and M1_2 are interconnected in the overlap with M1_2V.

Because the short-circuited portions are replaced with the tentative wiring layers and virtual via layers are placed in overlaps of the tentative wiring layers and the original wiring layer to maintain the connection with the original wiring layer, circuit extraction from the layout in which short-circuits are corrected by the layout verification means according to the first embodiment of the present invention will result in the same circuit interconnections that would be provided if wiring without short circuits were provided.

Figure 10:
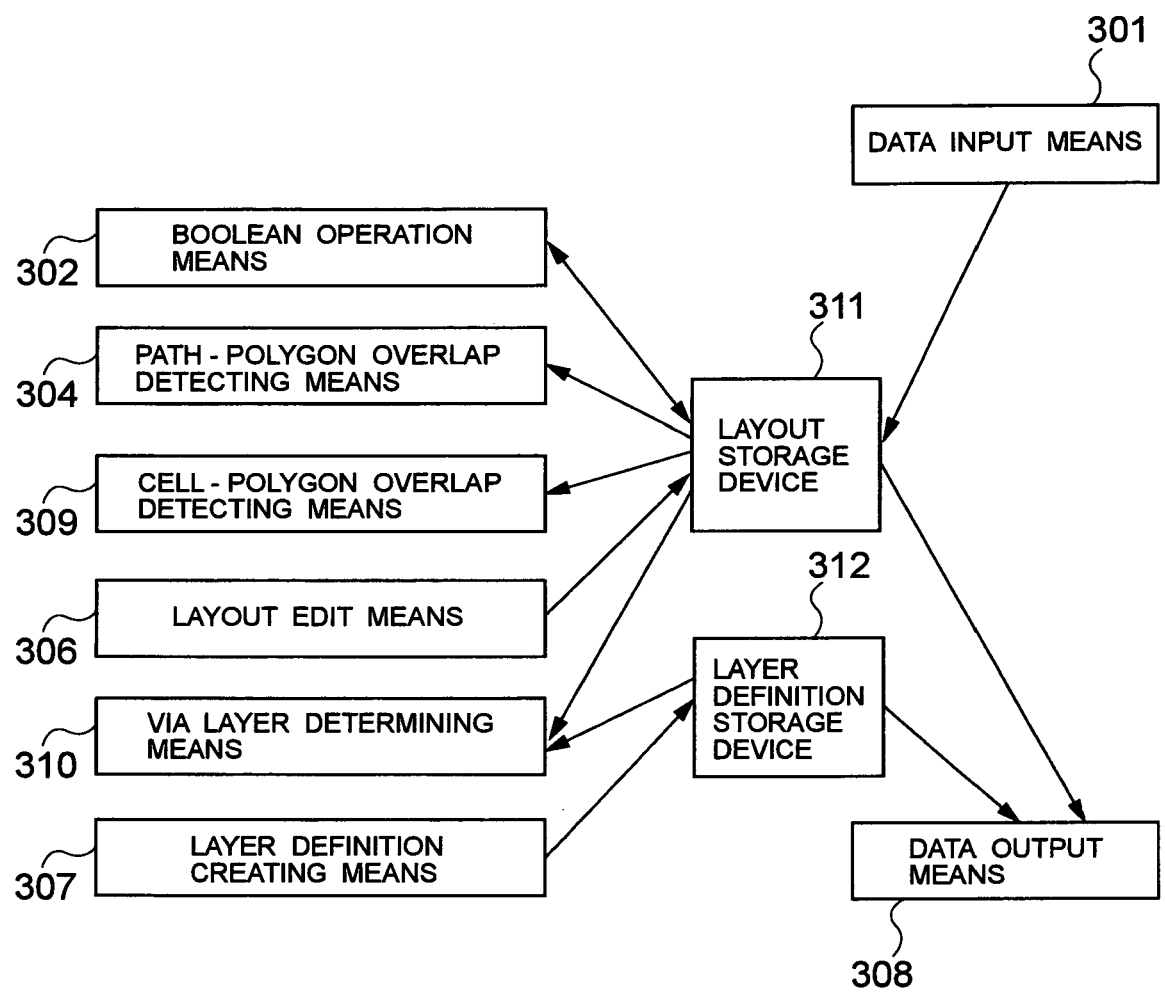
FIG. 10 is a functional block diagram showing a specific configuration of short-circuit correcting means used in a second embodiment of the present invention.

A second embodiment of the present invention will be described below in detail with reference to the drawings. The general configuration of the second embodiment is the same as that of the first embodiment (FIG. 1) and therefore the description of which will be omitted. FIG. 10 shows the second embodiment of the short-circuit correcting means 102 shown in FIG. 1 and the components equivalent to those in FIG. 3 are labeled with the same reference numerals. Referring to FIG. 10, the short-circuit correcting means 102 includes data input means 301, boolean operation means 302, path-polygon overlap detecting means 304, cell-polygon overlap detecting means 309, layout edit means 306, via layer determining means 310, layer definition creating means 307, data output means 308, a layout storage device 311, and a layer definition storage device 312.

These means and devices operate in principle as follows. The layout storage device 311 is the same as the layout storage device 311 shown in FIG. 3. The layer definition storage device 312 stores any number of tentative wiring names for each original wiring layer. It also stores tentative via layer names associated one to one with a pair of two continuous layers, including tentative wiring layers. The data input means 301 is the same as the data input means 301 shown in FIG. 3. The boolean operation means 302 is also the same as the boolean operation means 302 shown in FIG. 3. The path-polygon overlap detecting means is the same as the path-polygon overlap detecting means 304 in FIG. 3.

The cell-polygon overlap detecting means 309 reads a specified polygon from the layout storage device 311, searches the layout storage device 311 to find a cell including a figure that overlaps a polygon. The layout edit means 306 is the same as the layout edit means 306 shown in FIG. 3. The via layer determining means 310 checks wiring layers of the upper and lower wiring layer polygons of a via cell and searches the layer definition storage device 312 to retrieve the via layer name associated with the two wiring layers. The layer definition creating means 307 creates a tentative wiring layer name for a specified wiring layer and tentative via layer names associated one to one with a pair of continuous layers, including tentative wiring layers, and writes them in the layer definition storage means 312. The data output means 308 is the same as the data output means 308 shown in FIG. 3.

The data output means 308 reads wiring layouts of nets from the layout storage device 311 and writes them into the layout database 113 shown in FIG. 1. It also reads layer definitions from the layer definition storage device 312 and, for a tentative wiring layer used, outputs to the inter-layer connection information file 111 shown in FIG. 1 a description of an inter-layer connection method, including the original wiring layer names, tentative wiring layer names, and tentative via layer names associated with these two layers.

Figure 11:
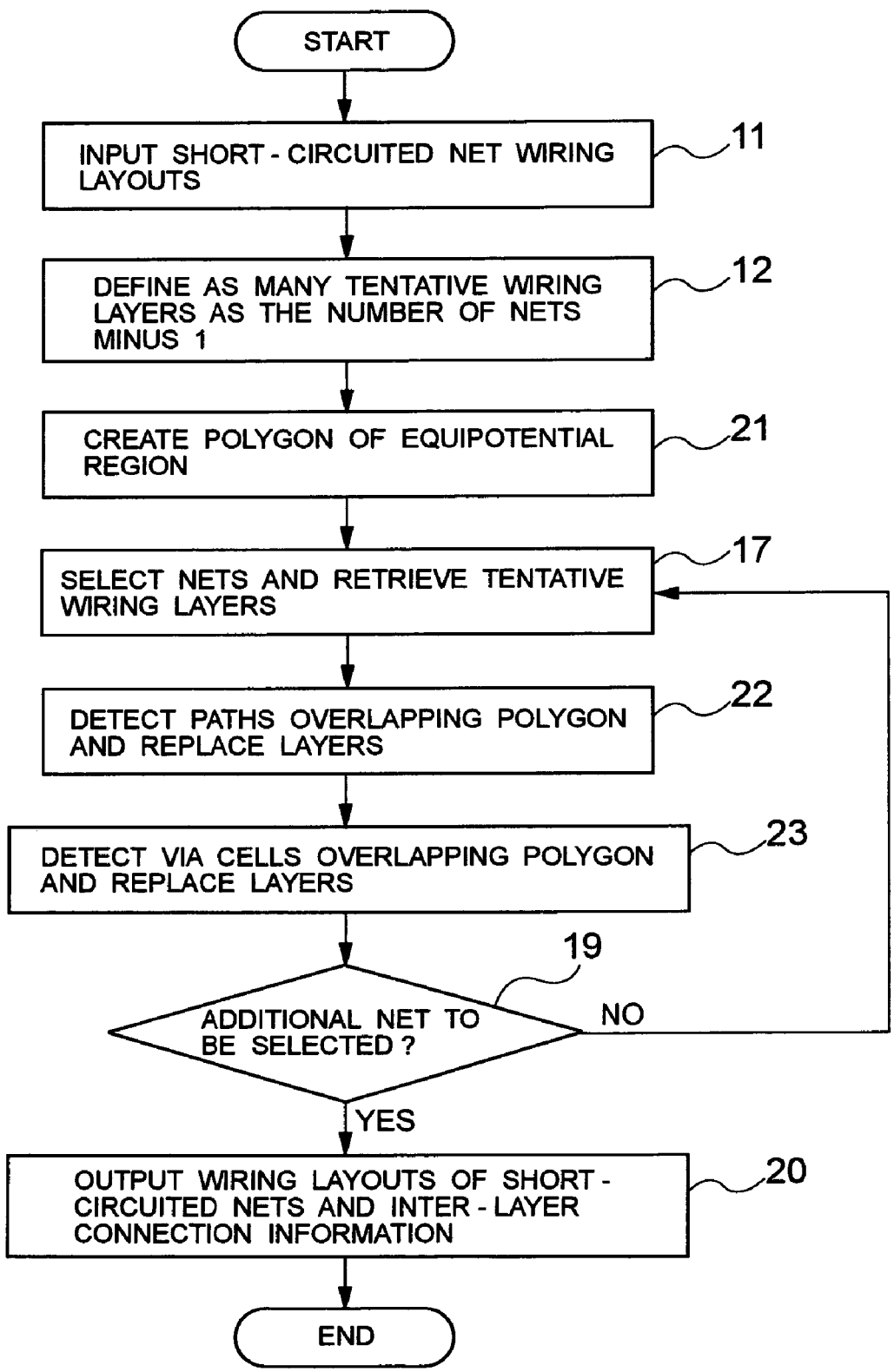
FIG. 11 is a flowchart illustrating an operation of the short-circuit correcting means shown in FIG. 10.

Operation of the second embodiment of the present invention will be described below in detail with reference to the flowchart in FIG. 11. The steps in FIG. 11 that are equivalent to those shown in FIG. 4 are labeled with the same reference numerals. First, a wiring layout of each of nets that are shorted to each other is read for each net from the layout database 113 in FIG. 1 and is written in the layout storage device 311 by the data input means 301 for each net (step 11).

Then, for all wiring layers of the input wiring layouts, definitions of as many tentative wiring layers as the number of input nets minus, and the via layer names associated with pairs of possible continuous two layers, including the tentative wiring layers, are written in the layer definition storage device 312 (step 12). The wiring layouts are read from the layout storage device 311 by the geometry logical operation means 302, the OR operation is applied to the wiring layouts of all nets, and polygons representing equipotential regions in the same layer are created and written in the layout storage device (step 21).

Then, one net is selected and the definition of a first tentative wiring layer associated with the wiring layer of the net is obtained (step 17). Nets that do not need corrections are determined as appropriate on the basis of an indicator such as the length of wiring, whether or not they overlap a terminal geometry, or the priority of wiring. Then, the wiring layout of the current net in the layout storage device 311 is checked by the path-polygon overlap detecting means 304 to detects paths that overlap the polygon created at step 21 and the wiring layers of the detected paths are replaced with the tentative wiring layers by the layout edit means 306 (step 22).

Then, the wiring layouts in the layout storage device 311 are checked by the cell-polygon overlap detecting means 309 to detect vias that overlap the polygons created at step 21, and one of the upper or lower lying wiring layer polygon of a detected via is replaced with the tentative wiring layer and the via layer of the via hole is replaced with the tentative via layer obtained by the via layer determining means 310, by the layout edit means 306 (step 23). Then, if there is an additional net to be selected, the process returns to step 17; otherwise, the process proceeds to the next step (step 19).

Finally, the wiring layouts of the nets stored in the layout storage device 311 are output to the layout database 113 in FIG. 1 by the data output means 308. For the tentative wiring layers used, the set of the original wiring layer names, tentative wiring names, and tentative via layer names associated with these two layers stored in the layer definition storage device 312 are output to the inter-layer connection information file 111 in FIG. 1 (step 20).

The second embodiment of the present invention will be further described below with respect to a specific exemplary pattern layout for better lower standing of the second embodiment. The exemplary pattern layout is the same as that described with respect to the first embodiment and shown in FIG. 5.

Figure 12:
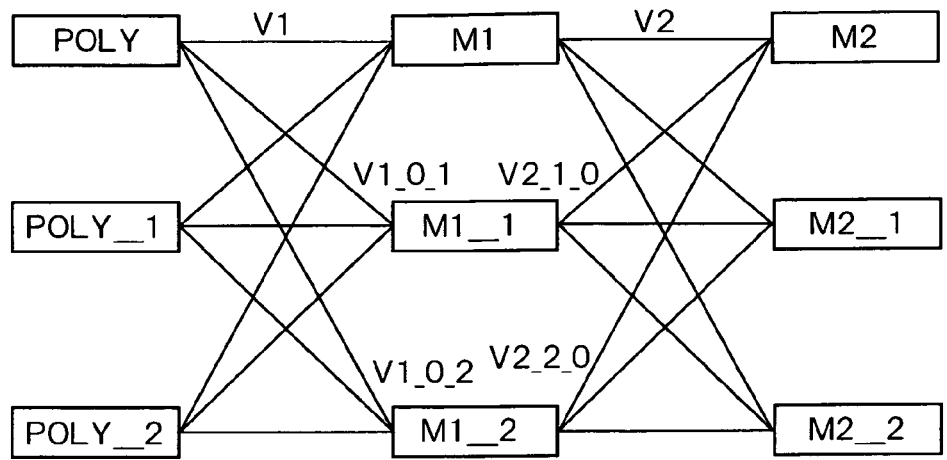
FIG. 12 is a schematic diagram showing an exemplary layer definition and inter-layer connections used in the second embodiment of the present invention.

First, in an example in FIG. 5, because three nets A, B, and C are shorted to one another, two tentative wiring layers are first created by the layer definition creating means 1107 for each of the polysilicon, the first metal layer, and the second metal layer and are written in the layer definition storage device 312 (step 12). FIG. 12 shows a schematic diagram of an example of the layer definition written in the layer definition storage device 312 and inter-layer interconnections.

In FIG. 12, the original polysilicon, the first metal layer, and the second metal layer are denoted as POLY, M1, and M2, respectively. The polysilicon—via layer of the first metal layer, which is the original via layer, and the first metal layer—the second metal layer, are denoted as V1 and V2, respectively. The wiring layers are represented by rectangles and the via layers between the wiring layers are represented by straight lines. The tentative wiring layers of the polysilicon layer are denoted as POLY_1 and POLY_2, the tentative wiring layer of the first metal layer is denoted as M1_1 and M1_2, the tentative wiring layer of the second metal layer is denoted as M2_1 and M2_2, the via layer interconnecting POLY and M1_2 is denoted as V1_0_1, the via layer interconnecting M1_1 and M2 is denoted as V2_1_0, and the via layer interconnecting M1_2 and M2 is denoted as V2_2_0 in the example. The other via layers are represented only by straight lines without names.

Figure 13:
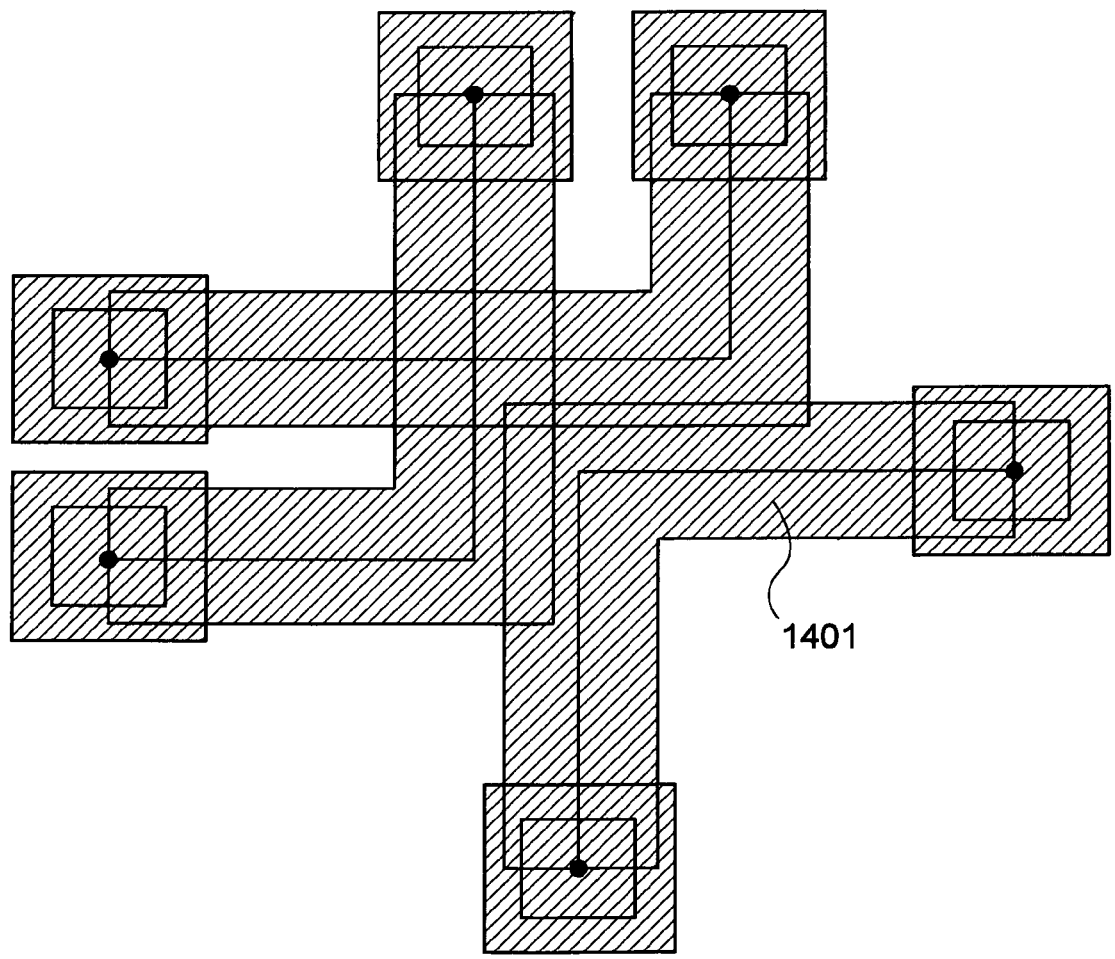
FIG. 13 shows an example of a polygon in an equipotential region in a layer in the second embodiment of the present invention.
Figure 14:
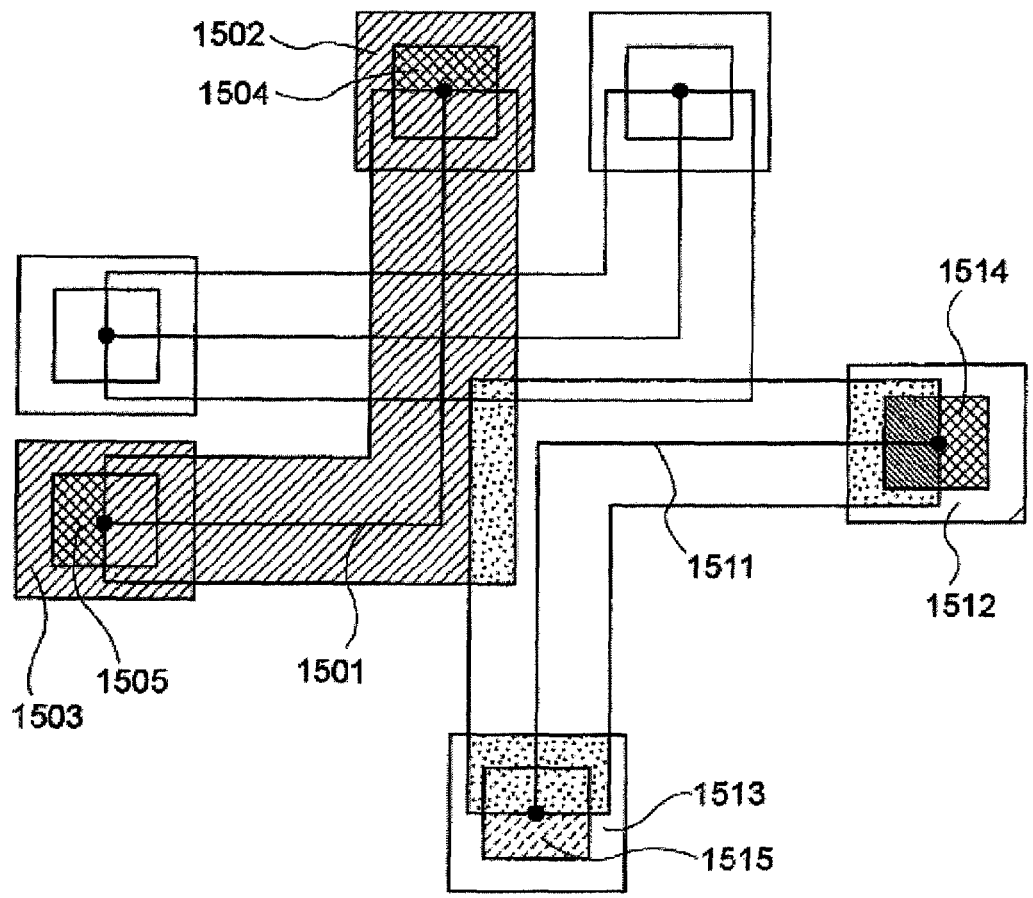
FIG. 14 is a diagram illustrating an example of short-circuit correction by virtual path wiring in the example shown in FIG. 13.
Figure 15:
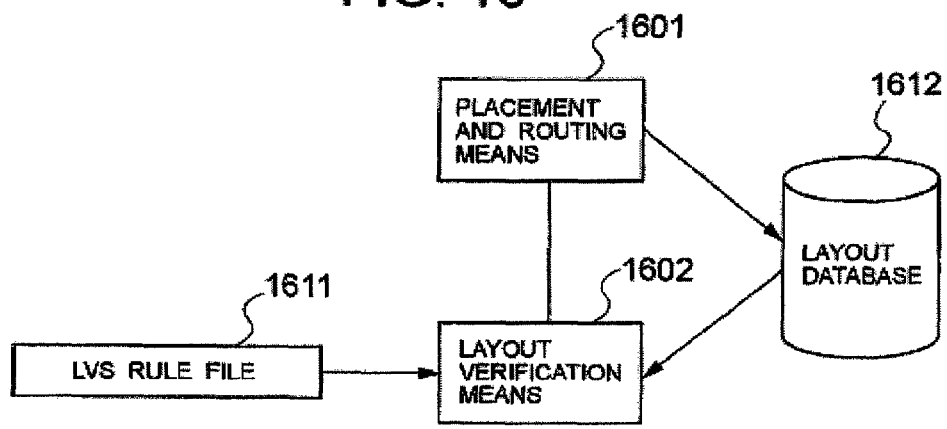
FIG. 15 is a functional block diagram illustrating the conventional art.

Then, the OR operation is applied to the wiring layouts of all nets by the boolean operation means 302 to obtain the geometry (indicated by hatched lines) 1401 as shown in FIG. 13 (step 21). Nets B and C are then selected from among the three nets as nets to be corrected. Net B is selected first and obtains a first tentative wiring layer M1_1 of the first metal layer is obtained (step 17). Then, a path of the first metal layer of net B that overlaps the geometry 1401 shown in FIG. 13 is detected by the path-polygon overlap detecting means 304. This is the path 622 shown in FIG. 5, which is then replaced with M1_1 by the layout edit means 306 to obtain the portion 1501 shown in FIG. 14 (step 22).

Then, a via cell that overlaps the geometry 1401 shown in FIG. 13 is searched for by the cell-polygon overlap detecting means 306 to obtain the via cells 621 and 623 shown in FIG. 5. The via cell 621 in FIG. 5 is a polysilicon—the first metal via cell and the two wiring layer polygons of the via cell are POLY and M1. The wiring layer polygon of M1 is first replaced with the tentative wiring layer M1_1 by the via layer edit means 306 to provide the portion 1502 in FIG. 14. Then, the via cell is checked by the via layer determining means 310 and a via layer that interconnects the POLY of the wiring layer polygon and M1_1 is retrieved from the layer definition storage device 312, and the via layer of V1 is replaced with V1_0_1. The resulting via is indicated by reference numeral 1504 in FIG. 14 (step 23).

Reference numeral 623 in FIG. 5 denotes a via cell of the first metal layer—the second metal layer, and two wiring layer polygons of the via cell are M1 and M2. The wiring layer polygon of the first metal layer is first replaced with the tentative wiring layer M1_1 by the layout edit means 306 to provide the portion indicated by reference numeral 1503 in FIG. 14. Then, the via layer determining means 310 checks the via cell to find that the two wiring layer polygons are M1_1 and M2. Therefore, the via layer determining means 310 retrieves the via layer interconnecting the two layers from the layer definition storage device 312 and replaces the V2 via layer with V2_1_0. The result is the portion 1504 in FIG. 14 (step 23).

Then, net C is selected and the second tentative wiring layer M1_2 of the first metal layer is retrieved from the layer definition storage means 312 (step 17) and then steps 23 and 19 are performed. As a result, portions 1511, 1512, 1513 in FIG. 14 become M1_2, portion 1514 become the via layer V1_0_2 between the POLY and M1_2, and portion 1515 becomes the via layer V2_2_0 between the M1_2 and M2.

Because there is no additional net to select, the process proceeds to the next step, where the data output means 308 refers to the definition of the wiring layout stored in the layout storage device 311 and the tentative wiring layer stored in the layer definition storage device 312 and outputs the inter-layer connection method for the tentative wiring layer to the inter-layer connection information file 111 shown in FIG. 1 (step 20). If the inter-layer connection method is expressed, for example, as (wiring layer 1 to connect, wiring layer 2 to connect, via layer), then the outputs of the present embodiment will be (POLY, M1_1, V1_0_1,), (POLY, M1_2, V1_0_2), (M1_1, M2, V2_1_0), and (M1_2, M2, V2_2_0).

Advantageous effects of the second embodiment described above will be described below. When nets A, B, and C overlap one another on the first metal layer path, the net A remains the original wiring layer M1, in the net B the path connecting between the via cells is replaced with the first tentative wiring layer M1_1 of the first metal layer and in the net C the path connecting between the via cells is replaced with the second tentative wiring layer M1_2 of the first metal layer. Consequently, the short-circuit of the path interconnecting the via cells of net B and net C is eliminated.

In addition, the layout verification means 103 specifies an inter-layer connection method in which the polysilicon—the first metal layer via layer of net B is replaced with the tentative via layer V1_0_1, that of net C is replaced with via layer V1_0_2, the first metal layer—the second metal layer via layer of net B is replaced with the tentative via layer V2_1_0, and that of net C is replaced with the tentative via layer V2_2_0, and the polysilicon and M1_1 are interconnected in the overlap with V1_0_1, the polysilicon and M1_2 are interconnected at the overlap with V1_0_2, M1_1 and M2 are interconnected in the overlap with the V2_1_0, M1_2 and M2 are interconnected in the overlap with V2_2_0. Thus, the tentative wiring layers and the original wiring layers are interconnected by the tentative via layers.

The paths in which short circuits have occurred are replaced with the tentative wiring layers and the connections between the tentative wiring layers and the original wiring layers are maintained by the tentative via layers on the via cell. Thus, circuit extraction by the layout verification means 103 from the layout in which the short circuits have been corrected according to the second embodiment of the present invention will result in the same circuit connections that would be provided when wiring without the short circuits were drawn.

It will be apparent that the processes of the embodiments and operation flows described above can also be embodied as a computer program and the program can be stored on a recording medium such as a ROM. The program can be read by a CPU, which is a computer, and can cause the computer to execute the processes.

The present invention has the advantageous effect that a LVS verification can be performed on a layout containing wiring short circuits before completion of a placement and wiring design stage. This is because short-circuit portions in wiring are corrected by using a newly defined tentative wiring layer to eliminate the short circuits, an inter-layer connection method for interconnecting the tentative wiring layer and the original wiring layer is output, the inter-layer connection for the tentative wiring layer is reflected in an LVS rule file, and the layout from which the short circuits have been eliminated by the tentative wiring layer included can be input into layout verification means.

What is claimed is:

1. A layout design system for an integrated circuit, comprising short-circuit correcting means for correcting a short circuit in a wiring layout, and layout verification means for comparing a layout corrected by the short-circuit correcting means with an integrated circuit schematic,
    wherein the short-circuit correcting means comprises means for replacing a short-circuited portion in the wiring layout with a separately defined tentative wiring layer, means for rewiring the wiring layout, and means for describing an inter-layer connection method between the tentative wiring layer and the original wiring layer, and
    wherein the layout verification means verifies the layout corrected by the short-circuit correcting means by performing a comparison between the corrected layout and the integrated circuit schematic in which the inter-layer connection method is reflected as a rule.

2. The layout design system according to claim 1, wherein the means for rewiring places a virtual via layer in an overlap between the original wiring layer and the tentative wiring layer to maintain a connection to the original wiring layer.

3. A layout design method for an integrated circuit, comprising a short-circuit correcting step of correcting a short circuit in a wiring layout, and a layout verification step of comparing a corrected layout with an integrated circuit schematic,
    wherein the short-circuit correcting step comprises a step of replacing a short-circuited portion in the wiring layout with a separately defined tentative wiring layer and rewiring, and a step of describing an inter-layer connection method between the tentative wiring layer and the original wiring layer, and
    wherein the layout verification step verifies the layout corrected by the short-circuit correcting step by performing a comparison between the corrected layout and the integrated circuit schematic in which in which the inter-layer connection method is reflected as a rule.

4. The layout design method according to claim 3, wherein the step of rewiring places a virtual via layer in an overlap between the original wiring layer and the tentative wiring layer to maintain a connection to the original wiring layer.

5. A program for causing a computer to perform a method for designing a layout of an integrated circuit, comprising a short-circuit correcting process of correcting a short circuit in a wiring layout, and a layout verification process of comparing a corrected layout with an integrated circuit schematic,
    wherein the short-circuit correcting process comprises a process of replacing a short-circuited portion in the wiring layout with a separately defined tentative wiring layer, a process of rewiring the wiring layout, and a process of describing an inter-layer connection method between the tentative wiring layer and the original wiring layer, and
    wherein the layout verification process verifies the layout corrected by the short-circuit correcting process by performing a comparison between the corrected layout and the integrated circuit schematic in which the inter-layer connection method is reflected as a rule.

6. The program according to claim 5, wherein the process of rewiring places a virtual via layer in an overlap between the original wiring layer and the tentative wiring layer to maintain a connection to the original wiring layer.

* * * * *